United States Patent
Kim et al.

(10) Patent No.: US 10,559,429 B2
(45) Date of Patent: Feb. 11, 2020

(54) PHOTOSENSITIVE ORGANIC CAPACITOR

(71) Applicant: Kyungpook National University Industry-Academic Cooperation Foundation, Daegu (KR)

(72) Inventors: Youngkyoo Kim, Daegu (KR); Hwajeong Kim, Daegu (KR); Chulyeon Lee, Daegu (KR)

(73) Assignee: KYUNGPOOK NATIONAL UNIVERSITY INDUSTRY—ACADEMIC COOPERATION FOUNDATION, Daegu (KR)

( * ) Notice: Subject to any disclaimer, the term of this patent is extended or adjusted under 35 U.S.C. 154(b) by 0 days.

(21) Appl. No.: 15/643,647

(22) Filed: Jul. 7, 2017

(65) Prior Publication Data
US 2018/0197687 A1    Jul. 12, 2018

(30) Foreign Application Priority Data
Jul. 7, 2016    (KR) .......................... 10-2016-0085897

(51) Int. Cl.
*H01G 9/20*    (2006.01)
*H01G 9/15*    (2006.01)

(52) U.S. Cl.
CPC ......... *H01G 9/2009* (2013.01); *H01G 9/2022* (2013.01); *H01G 9/15* (2013.01);
(Continued)

(58) Field of Classification Search
CPC ...... H01L 31/00–078; Y02E 10/50–60; H01G 9/20–2095
(Continued)

(56) References Cited

U.S. PATENT DOCUMENTS

2008/0230120 A1*    9/2008 Reddy .................. H01L 27/302
                                              136/260
2010/0307791 A1*   12/2010 Kim ...................... H01B 1/128
                                              174/126.1
(Continued)

OTHER PUBLICATIONS

Lee et al., Aqueous Solution-Processable Small Molecular Metal-Chelate Complex Electrolyte for Flexible All-Solid State Energy Storage Devices, 2015, Advanced Energy Materials, vol. 5, Issue 14, pp 1500402 (Year: 2015).*

*Primary Examiner* — Bach T Dinh
(74) *Attorney, Agent, or Firm* — Porzio Bromberg & Newman P.C.

(57) ABSTRACT

The present disclosure relates to a photosensitive organic capacitor whose capacitance efficiency is increased if light is applied to the photosensitive organic capacitor, and the photosensitive organic capacitor includes an upper substrate and a lower substrate that are spaced apart by a certain interval, an upper electrode and a lower electrode that are attached to each opposing side of the upper substrate and lower substrate, an active layer that is formed between the upper electrode and the lower electrode, and an upper polarization-inducing layer and a lower polarization-inducing layer that are formed between the upper electrode and the active layer and between the lower electrode and the active layer, and that induce the polarization of charges within the active layer if light is applied to the photosensitive organic capacitor.

4 Claims, 4 Drawing Sheets

(52) U.S. Cl.
CPC ............... *H05K 2201/0145* (2013.01); *H05K 2201/0154* (2013.01)

(58) Field of Classification Search
USPC .................................................. 136/243–265
See application file for complete search history.

(56) References Cited

U.S. PATENT DOCUMENTS

2015/0340160 A1* 11/2015 Kim ..................... H01G 9/042
361/523
2017/0114240 A1* 4/2017 Bao ..................... H01L 51/0021

\* cited by examiner

PHOTOSENSITIVE ORGANIC CAPACITOR

CROSS-REFERENCE TO RELATED APPLICATIONS

This application claims the benefit under 35 USC 119(a) of Korean Patent Application No. 10-2016-0085897 filed on Jul. 7, 2016 in the Korean Intellectual Property Office, the entire disclosure of which is incorporated herein by reference for all purposes.

BACKGROUND

1. Field

The present disclosure relates to a photosensitive organic capacitor. In detail, the present disclosure relates to a photosensitive organic capacitor that uses a solid-state electrolyte for an active layer and uses a photosensitive organic polymer substance for a polarization-inducing layer which is added to induce polarization of charges within the active layer, and thus, it is possible to produce a photosensitive organic capacitor that can have flexibility and remarkably increase the capacitance efficiency of the active layer by exposure to light.

2. Description of Related Art

With the rapid development of mobile information communication devices and the increase of information, the power consumption also increases, and therefore, the increase of battery capacity is certainly needed for the convenient use of devices.

In addition, renewable energy industries are mostly restricted by the absence of a storage capacity for high energy density. For example, an electric car needs a storage battery and an electric condenser with high energy density and high output density.

In spite of efforts to meet those needs, it is still difficult to sustainably increase the energy density and power density.

On the other hand, a super capacitor whose specific capacitance is improved several thousand times compared to the specific capacitances of ordinary capacitance capacitors is in the spotlight as a next-generation energy storage for higher power density, quicker charge and discharge rates, eco-friendly properties, a longer lifetime, a lower cost per charge/discharge cycle.

However, typical super capacitors are fabricated by inserting liquid electrolytes between electrodes such as carbon electrodes on a metal membrane. These super capacitors are basically fabricated using solid materials which result in a lack of flexibility and liquid electrolytes which may lead to the electrolyte leakage between electrodes, so there is a problem that those super capacitors are not appropriate to apply to a flexible electronic device or Nano-device.

SUMMARY

According to the present disclosure, a photosensitive organic capacitor is provided. The photosensitive organic capacitor comprises an upper substrate and a lower substrate that are spaced apart by a certain interval, an upper electrode and a lower electrode that are attached to each opposing side of the upper substrate and lower substrate, an active layer that is formed between the upper electrode and the lower electrode, and an upper polarization-inducing layer and a lower polarization-inducing layer that are formed between the upper electrode and the active layer and between the active layer and the lower electrode and induce polarization of charges within the active layer if light is applied to the photosensitive organic capacitor.

Herein, the upper and lower polarization-inducing layers comprise a photosensitive organic polymer substance, and the photosensitive organic polymer substance is poly-3-hexylthiophene (P3HT).

In addition, the active layer comprises a solid-state electrolyte comprising a monomer. The solid-state electrolyte is tris(8-hydroxyquinoline-5-sulfonic acid) aluminum ($ALQSA_3$).

The upper substrate and lower substrate are one selected from Polyethylene terephthalate (PET), Polyethylene Naphthalate (PEN), Polyimide, Polyether ether ketone (PEEK), Polyethersulfone (PES), and Polyethylenimine (PEI).

DETAILED DESCRIPTION

Figure 1:
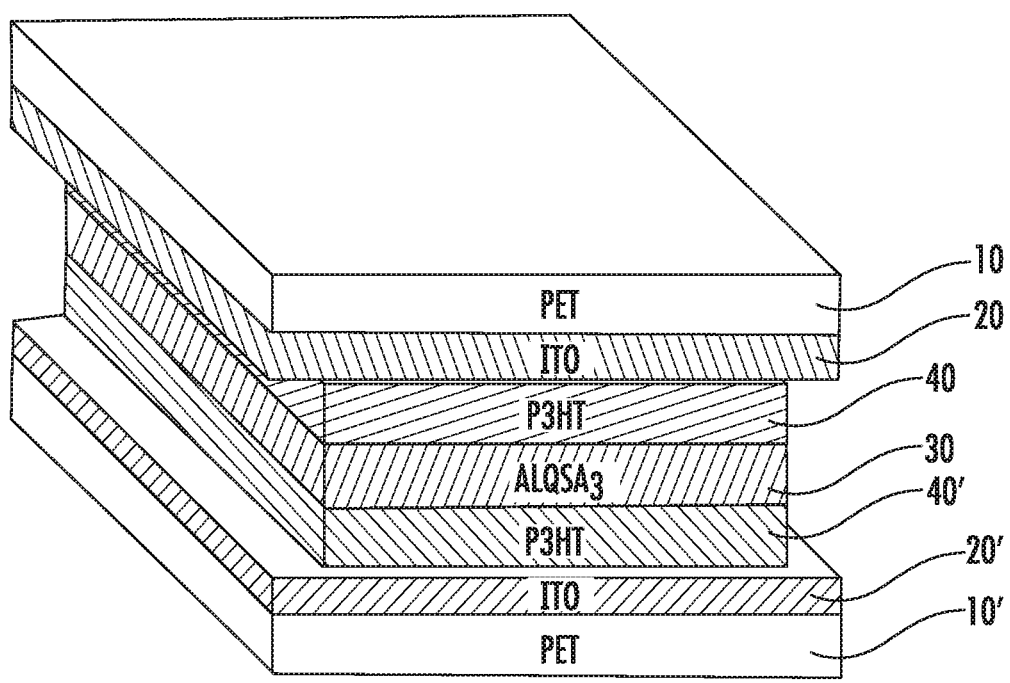
FIG. 1 is a diagram of a photosensitive organic capacitor according to an example of the present disclosure.

The present disclosure is provided to introduce a photosensitive organic capacitor that uses a solid electrolyte for an active layer and uses a photosensitive organic polymer substance for a polarization-inducing layer which is added to induce polarization of charges within the active layer to make the photosensitive organic capacitor flexible, and it also remarkably increases the capacitance efficiency of the active layer by exposure to light.

Hereinafter, the present disclosure is described in more detail by referring to the drawings. The identical elements of the drawings refer to the same reference numerals throughout the drawings. In addition, the well-known function and feature may be omitted to avoid obscuring the concept of the present disclosure.

FIG. 1 is a diagram of a photosensitive organic capacitor according to an example of the present disclosure.

Referring to FIG. 1, a photosensitive organic capacitor according to an example may comprise an upper substrate and a lower substrate that are spaced apart by a certain interval, an upper electrode and a lower electrode that are attached to each opposing side of the upper substrate and lower substrate, an active layer that is formed between the upper electrode and the lower electrode, and an upper polarization-inducing layer and a lower polarization-inducing layer that are formed between the upper electrode and the active layer and between the lower electrode and the active and induce the polarization of charges within the active layer if light is applied to the photosensitive organic capacitor.

The upper and lower substrates 10, 10' may be a pair of substrates spaced apart by a certain interval and provide a region in which upper and lower electrodes 20, 20', an active layer 30, and upper and lower polarization-inducing layers 40, 40' are formed.

The upper and lower substrates 10, 10' may be used as a glass substrate that is ordinarily used in the art or a bendable polymer substrate. In the present disclosure, a bendable polymer substrate with high chemical stability, mechanical strength, and transparency may be used for the penetration of light through upper and lower polarization-inducing layers 40, 40' and the implementation of a flexible capacitor.

For example, the upper and lower substrates 10, 10' may be one selected from Polyethylene terephthalate (PET), Polyethylene Naphthalate (PEN), Polyimide, Polyether ether ketone (PEEK), Polyethersulfone (PES), and Polyethylenimine (PEI), and the PET is used in the present disclosure.

The upper and lower electrodes 20, 20' may be attached to each opposing side of the upper and lower substrates 10, 10', and materials with high conductivity, such as gold, copper, platinum, aluminum, are used for the electrodes. In the present disclosure, a transparent electrode may be used so that light is penetrated into the upper and lower polarization-inducing layers 40, 40'.

The transparent electrode may use one selected from transparent oxide (e.g. Iindium Tin Oxide (ITO)), conductive polymer, graphene thin film, and carbon nanotube thin film, and the ITO is used in the present disclosure.

The active layer 30 is formed between the upper and lower electrodes 20, 20' and comprises a solid-state monomer electrolyte having the capacitance, and tris(8-hydroxyquinoline-5-sulfonic acid)aluminum ($ALQSA_3$) may be used for the active layer.

If a direct current power is applied to the upper and lower electrodes 20, 20', charges whose polarities are opposite to the polarity of the direct current power individually applied to the upper and lower electrodes 20, 20' become accumulated at boundaries between the upper electrode 20 and the upper polarization-inducing layer 40 and between the lower polarization-inducing layer 40' and the lower electrode 20'. In consequence, the active layer 30 provides a capacitance function.

The upper and lower polarization-inducing layers 40, 40' are formed between the upper electrode 20 and the active layer 30 and between the active layer 30 and the lower electrode 20'. If light is applied to the photosensitive organic capacitor, the polarization of charges within the active layer is induced by the upper and lower polarization-inducing layers 40, 40'. Poly-3-hexylthiophene (P3HT), which is a photosensitive organic polymer substance, may be used for the upper and lower polarization-inducing layers 40, 40'.

In detail, if light is applied to the photosensitive organic capacitor while a direct current power is applied to the upper and lower electrodes 20, 20', charges whose polarities are opposite to the polarity of the direct current power individually applied to upper and lower electrodes 20, 20' are accumulated near a boundary between the upper electrode 20 and the upper polarization-inducing layer 40 and are accumulated near a boundary between the lower polarization-inducing layer 40' and the lower electrode 20', and respective charges whose polarities are the same as the polarity of charge of the power applied to the upper and lower electrodes 20, 20' are accumulated near a boundary between the upper polarization-inducing layer 40 and the active layer 30 and near a boundary between the active layer 30 and the lower polarization-inducing layer 40'.

According to the present disclosure, if light is applied to the photosensitive organic capacitor, the amount of charges accumulated near boundaries between the upper polarization-inducing layer 40 and the active layer 30 and between the active layer 30 and the lower polarization-inducing layer 40' becomes bigger.

As charges accumulated at the boundaries between the upper polarization-inducing layer 40 and the active layer 30 and between the active layer 30 and the lower polarization-inducing layer 40' may induce the polarization of charges within the active layer 30 and, therefore, the amount of charges accumulated at the boundaries gets larger, the capacitance efficiency of the active layer 30 remarkably increases.

In addition, a photosensitive organic capacitor according to an example of the present disclosure uses a solid-state electrolyte such as tris(8-hydroxyquinoline-5-sulfonic acid) aluminum ($ALQSA_3$) for the active layer 30 and uses an organic polymer substance such as P3HT for the upper and lower polarization-inducing layers 40, 40', so it is possible to implement a flexible capacitor.

It is also possible to provide a photosensitive organic capacitor with high structural stability since there is a strong binding between $ALQSA_3$ used for the active layer 30 and P3HT used for upper and lower polarization-inducing layers 40, 40'.

Hereinafter, operations of a photosensitive organic capacitor according to an example of the present disclosure are described referring to the drawings.

FIGS. 2 A and B is diagrams illustrating operations of a photosensitive organic capacitor in dark and light-on conditions according to an example of the present disclosure.

Figure 2A:
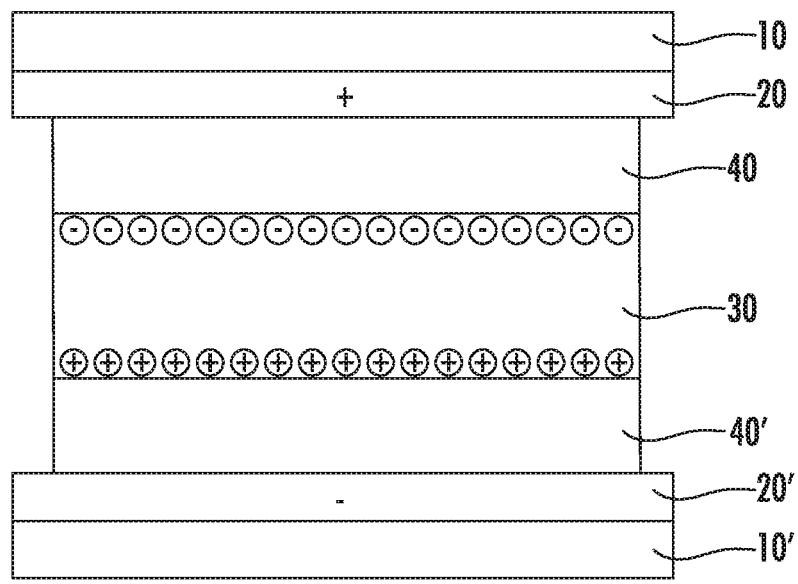
FIGS. 2 A and B is diagrams illustrating operations of a photosensitive organic capacitor in dark and light-on conditions according to an example of the present disclosure.

Referring to operations of a photosensitive organic capacitor according to an example illustrated in FIGS. 2 A and B, if the positive power is applied to the upper electrode 20 and the negative power is applied to the lower electrode 20' in a dark condition, where light is not applied to the photosensitive organic capacitor, negative charges are accumulated near a boundary between the upper polarization-inducing layer 40 and the active layer 30 and positive charges are accumulated near a boundary between the active layer 30 and the lower polarization-inducing layer 40', as illustrated in FIG. 2A.

Figure 2B:
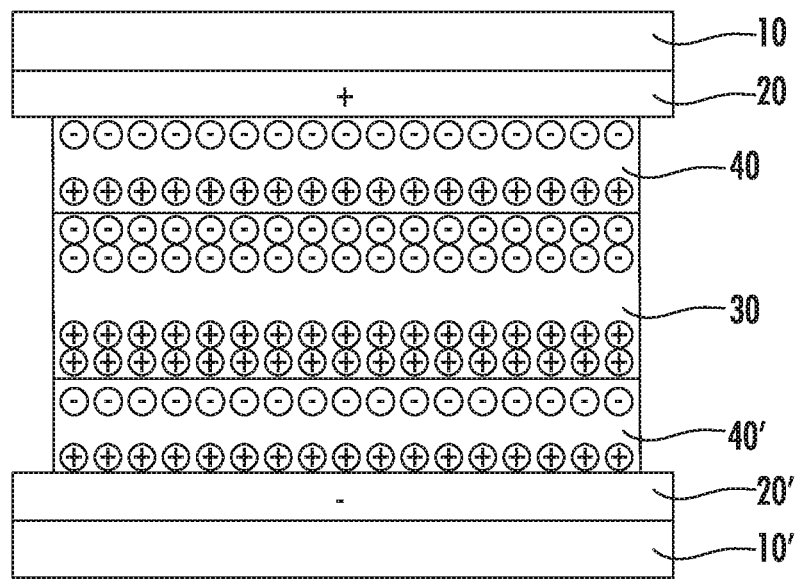

If light is applied to the photosensitive organic capacitor of the present disclosure in the above-mentioned state, negative charges are accumulated near a boundary between the upper electrode 20 and the upper polarization-inducing layer 40 and positive charges are accumulated near a boundary between the upper polarization-inducing layer 40 and the active layer 30, as illustrated in FIG. 2B.

Consequently, positive charges accumulated near the boundary between the upper polarization-inducing layer 40 and the active layer 30 induce the polarization of negative charges within the unpolarized active layer 30, so more negative charges are accumulated near the boundary between the active layer 30 and the upper polarization-inducing layer 40.

Positive charges are accumulated near a boundary between the lower polarization-inducing layer 40' and the lower electrode 20', and negative charges are accumulated near a boundary between the lower polarization-inducing layer 40' and the active layer 30.

Consequently, negative charges accumulated near a boundary between the active layer 30 and the lower polarization-inducing layer 40' induce the polarization of the unpolarized active layer 30, so more positive charges are accumulated near the boundary between the active layer 30 and the lower polarization-inducing layer 40'.

As described above, according to the present disclosure, if light is applied to a photosensitive organic capacitor in the state that the power is applied to the upper and lower electrodes 20, 20', charges accumulated near the boundary between the upper polarization-inducing layer 40 and the active layer 30 and near the boundary between the active layer 30 and the lower polarization-inducing layer 40' induce the polarization of the unpolarized active layer, so the density of charges that are accumulated at boundaries between the active layer 30 and the upper polarization-inducing layer 40 and between the active layer 30 and the lower polarization-inducing layer 40' becomes higher to increase the capacitance efficiency of the active layer 30.

Hereinafter, the process for the production of a photosensitive organic capacitor according to an example of the present disclosure is described.

1. Production of ALQSA$_3$ Solution

Mixing 0.61 g of aluminum triisopropoxide (AltiP) with 2.03 g of 8-hydroxyquinoline-5-sulfonic acid (HQSA), then the mixture was dissolved in a 10 ml of N,N-dimethylacetamide solvent.

After stirring the above solution for 10 minutes, the solution was heated until it reached 100° C. and then a condensation reaction was carried out at 100° C. for 6 hours.

The solution was cooled and poured into an isopropyl alcohol (IPA), and, as a result, a precipitate was created. ALQSA$_3$ powders were purified by recrystallization of the precipitate, and then the ALQSA$_3$ powders were vacuum-dried at 75° C. for 24 hours.

The 50 mg/ml of ALQSA$_3$ powders were dissolved in deionized water to produce ALQSA$_3$ solution.

2. Production of P3HT Solution

P3HT polymer for a concentration of 20 mg/ml was dissolved in chlorobenzene to produce P3HT solution.

3. Production of ITO-Coated PET Film

A PET film was coated with Indiumtinoxide (ITO) that is a transparent electrode material to produce a 125-μm-thick ITO-coated PET film.

To form stripe-patterns on a transparent electrode, a photolithography or etching was performed on an ITO electrode. The area of the ITO electrode is 12 mm*15 mm.

4. Production of Photosensitive Organic Capacitor

The patterned ITO-coated PET film was cleaned with IPA using an ultrasonic cleaner and dried with a flow of nitrogen gas to remove quickly any remaining liquid.

After a 50-nm-thick P3HT nanolayer was created by spin coating of P3HT solution at spin speed 1500 rpm to the ITO-coated PET film, the nanolayer was heated at 60° C. for 15 minutes. A P3HT nanolayer-coated ITO-PET substrate was created.

The P3HT nanolayer of the P3HT nanolayer-coated ITO-PET substrate was coated using ALQSA$_3$ solution with a thickness of 10 μm and dried at 80° C. for 20 minutes, and thus a ALQSA$_3$ film layer was produced.

The P3HT nanolayer of P3HT nanolayer-coated ITO-PET substrate was built on the ALQSA$_3$ film layer to be touched thereto, and they were built on the P3HT nanolayer-coated ITO-PET substrate to be fully attached to each other. Post-treatment process was carried out at 75° C. for 24 hours under vacuum. As a result, a photosensitive organic capacitor was produced.

Figure 3:
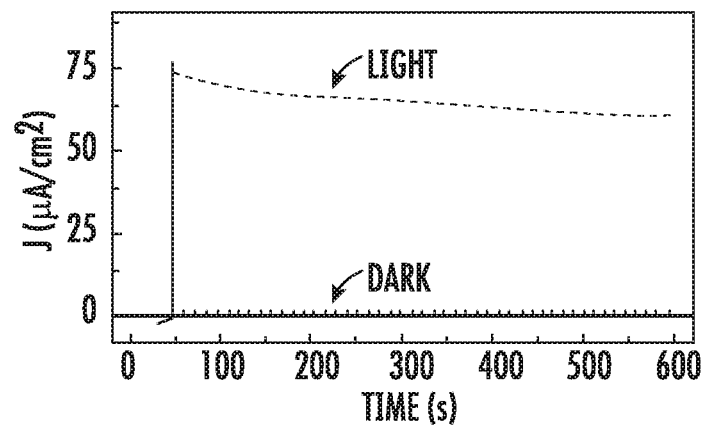
FIG. 3 is a graph of the current density over time of a photosensitive organic capacitor in dark and light-on conditions according to an example of the present disclosure.

FIG. 3 is a graph of the current density over time of a photosensitive organic capacitor in dark and light-on conditions according to an example of the present disclosure.

In the state that a voltage of 1V is applied to the photosensitive organic capacitor manufactured as described above, the experiment to measure respective current densities in a dark condition where light is not applied to the photosensitive organic capacitor and in a light-on condition where light is applied to the photosensitive organic capacitor by using a white light of 100 mW/cm$^2$, similar to a solar light.

As a result of experiment, as indicated on the graph of FIG. 3, it is understood that, according to the present disclosure, a current density remains at 0 without any change in the dark condition, whereas the current density remarkably increases in the light-on condition.

As described above, it is understood that the photosensitive organic capacitor according to an example has the feature that the capacitance efficiency is influenced to increase remarkably by exposure to light, contrary to ordinary capacitors.

Figure 4:
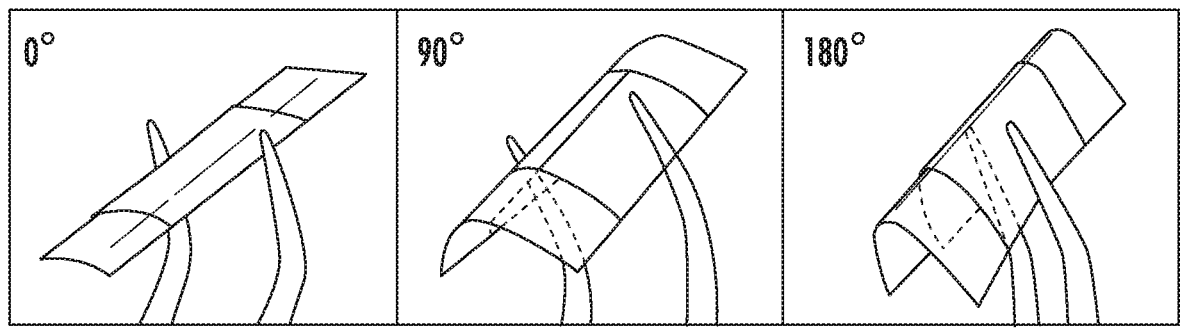
FIG. 4 is an image showing a photosensitive organic capacitor that bends in different bend angles according to an example of the present disclosure.
Figure 5:
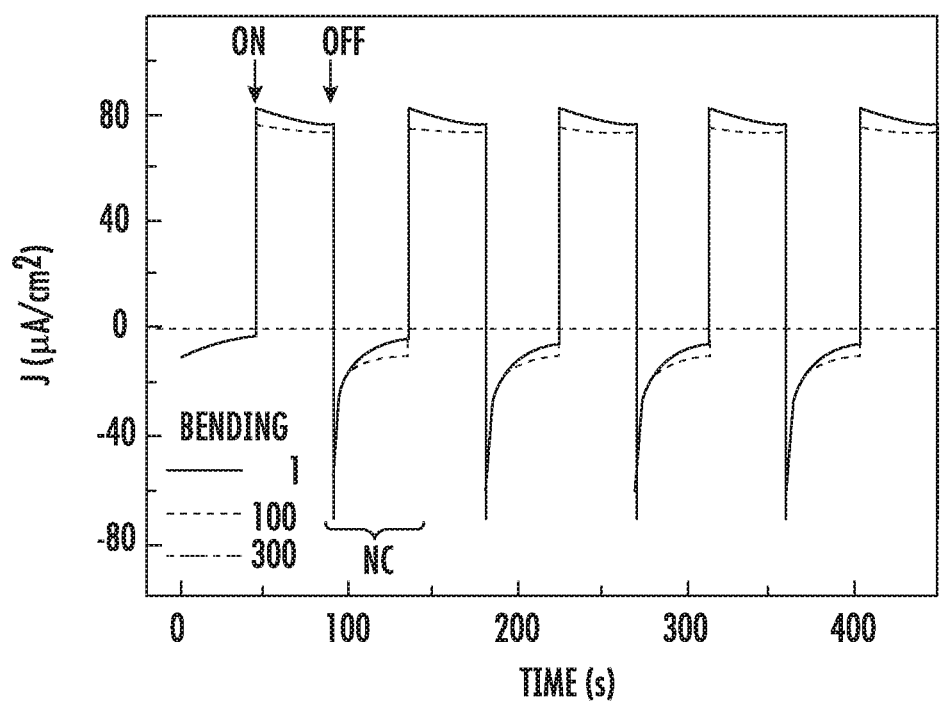
FIG. 5 is a graph of the current density over time of a photosensitive organic capacitor after bending for 0, 100, and 300 times according to an example of the present disclosure.

FIG. 4 is an image showing a photosensitive organic capacitor that bends in different angles according to an example of the present disclosure. FIG. 5 is a graph of the current density over time of a photosensitive organic capacitor after bending for 0, 100, and 300 times according to an example of the present disclosure.

Considering that a solid-state electrolyte is used for the active layer and an organic polymer substance is used for the upper and lower polarization-inducing layer, it is possible to implement the photosensitive organic capacitor manufactured as described above as a flexible device that is capable of easily being bent at 90° and 180°, as illustrated in FIG. 4.

An experiment was performed in which the photosensitive organic capacitor according to an example of the present disclosure was bent with an 180° bend 1 time, 100 times, and 300 times and then a current density was measured by applying or disrupting a voltage of 1V in the state that light such as white light of 100 mW/cm$^2$ has been applied to the photosensitive organic capacitor for each case.

As a result, as indicated on the graph of FIG. 5, the photosensitive organic capacitor according to an example of the present disclosure has no difference between the cases of 100-time and 300-time bendings and the case of 1-time bending in terms of the performance of the capacitor. Therefore, it is recognized that performance of the capacitor remains the same after the numerous bendings.

The photosensitive organic capacitor according to an example of the present disclosure has the feature that a current density is remarkably increased in a light-on condition where a voltage of 1V is applied while light such as a white light is applied. In other words, contrary to ordinary capacitors, the photosensitive organic capacitor is characterized by the feature that the capacitance efficiency is remarkably increased by exposure to light.

According to the present disclosure above, it is possible to produce a photosensitive organic capacitor with flexibility by using a solid-state electrolyte for an active layer and using a photosensitive organic polymer substance for a polarization-inducing layer which is added to induce the polarization of charges within the active layer. It is also possible to implement a photosensitive organic capacitor that is capable of increasing the capacitance efficiency of the active layer by exposure to light.

In addition, it is possible to implement an organic capacitor having a high structural stability resulting from a strong bond between tris(8-hydroxyquinoline-5-sulfonic acid)aluminum (ALQSA$_3$) used for a solid-state electrolyte and poly-3-hexylthiophene (P3HT) used for upper and lower polarization-inducing layers.

While this disclosure has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims.

What is claimed is:

1. A photosensitive organic capacitor comprising: an upper substrate and a lower substrate that are spaced apart by a certain interval; an upper electrode and a lower electrode that are attached to each opposing side of the upper substrate and lower substrate; an active layer that is formed between the upper electrode and the lower electrode; and an upper polarization-inducing layer and a lower polarization-inducing layer that are formed between the upper electrode and the active layer and between the lower electrode and the active layer, and induce polarization of charges within the active layer if light is applied, wherein the upper and lower polarization-inducing layers include poly-3-hexylthiophene (P3HT) and, the active layer includes tris(8-hydroxyquinoline-5-sulfonic acid) aluminum (ALQSA3) and wherein the photosensitive organic capacitor accumulates negative charges near a boundary between the upper polarization-inducing layer and the active layer and positive charges near a boundary between the active layer and the lower polarization-inducing layer, if positive power is applied to the upper electrode and negative power is applied to the lower electrode in a dark condition, where light is not applied to the photosensitive organic capacitor.

2. The capacitor of claim 1, wherein the upper and lower polarization-inducing layers comprise a photosensitive organic polymer substance.

3. The capacitor of claim 1, wherein the active layer comprises a solid-state electrolyte comprising a monomer.

4. The capacitor of claim 1, wherein the upper substrate and lower substrate are one selected from Polyethylene terephthalate (PET), Polyethylene Naphthalate (PEN), Polyimide, Polyether ether ketone (PEEK), Polyethersulfone (PES), and Polyethylenimine (PEI).

* * * * *